US006864924B2

United States Patent
Yamamoto

(10) Patent No.: US 6,864,924 B2
(45) Date of Patent: Mar. 8, 2005

(54) TELEVISION TUNER INPUT CIRCUIT HAVING SATISFACTORY SELECTION PROPERTIES AT HIGH BAND RECEPTION

(75) Inventor: Masaki Yamamoto, Fukushima (JP)

(73) Assignee: Alps Electric Co., Ltd., Tokyo (JP)

( * ) Notice: Subject to any disclaimer, the term of this patent is extended or adjusted under 35 U.S.C. 154(b) by 723 days.

(21) Appl. No.: 09/777,047

(22) Filed: Feb. 5, 2001

(65) Prior Publication Data

US 2001/0050726 A1 Dec. 13, 2001

(30) Foreign Application Priority Data

Feb. 10, 2000 (JP) ........................................ 2000-038204

(51) Int. Cl.$^7$ ............................. H04N 5/50; H04N 5/46
(52) U.S. Cl. ...................... 348/731; 348/732; 348/725; 348/729; 455/188.1; 455/191.3
(58) Field of Search ................................. 348/731, 732, 348/733, 725, 729, 705; 455/188.1, 191.3, 191.1, 191.2, 169.2, 340, 180.4, 278.1; 334/47, 87, 64

(56) References Cited

U.S. PATENT DOCUMENTS

| 4,731,877 A | 3/1988 | Moon |
| 4,756,024 A | 7/1988 | Kupfer |
| 5,054,117 A | 10/1991 | Cruz et al. |

FOREIGN PATENT DOCUMENTS

| GB | 2 136 230 | 9/1984 |
| JP | 08-097742 | 4/1996 |

*Primary Examiner*—Michael H. Lee
*Assistant Examiner*—Jean W. Desir
(74) *Attorney, Agent, or Firm*—Brinks Hofer Gilson & Lione

(57) ABSTRACT

The present invention provides a television tuner input circuit having satisfactory selection properties free from influence by half of signal frequencies to be received. The television tuner input circuit of the present invention has a tuning circuit and a high pass filter cascaded to the tuning circuit, wherein: the tuning circuit is switched to a low band or high band television signal reception state; when the tuning circuit is switched to a low band reception state, a cutoff frequency of the high pass filter is set lower than the minimum frequency of the low band; and when the tuning circuit is switched to a high band reception state, a cutoff frequency is set lower than the minimum frequency of the high band and higher than half of the maximum frequency thereof.

8 Claims, 3 Drawing Sheets

TELEVISION TUNER INPUT CIRCUIT HAVING SATISFACTORY SELECTION PROPERTIES AT HIGH BAND RECEPTION

BACKGROUND OF THE INVENTION

1. Field of the Invention

The present invention relates to a television tuner input circuit, and more particularly to an input circuit of a television tuner capable of switching so as to be tunable to plural frequency bands.

2. Description of the Prior Art

An input circuit of a conventional television tuner will be described with reference to FIG. 3. In FIG. 3, the input circuit of the television tuner comprises an input part 61, a CB trap circuit 62, an IF trap circuit 63, a tuning circuit 64, and an output part 65, which are connected in series, and first and second band switching terminals 66 and 67 for switching the tuning circuit 64 to a low band or high band television signal reception state. To the first band switching terminal 66, a switching voltage for switching the tuning circuit 64 to a low band television signal reception state is applied, and to the second band switching terminal 67, a switching voltage for switching the tuning circuit 64 to a high band television signal reception state is applied.

The input part 61 comprises a television signal input terminal 68, a coil 69 connected between the input terminal 68 and the ground, and a DC blocking capacitor 70 connected at one end thereof to the input terminal 68. The input terminal 68, connected with a television antenna (not shown), serves as an input end for television signals. The input circuit 61 is primarily used as provision against lighting.

The CB trap circuit 62 has a coil 71 and a capacitor 72 connected in series between the other end of the capacitor 70 and the ground. A resonance frequency of a series resonance circuit comprising the coil 71 and the capacitor 72 is set to a frequency used with citizen band transceivers, e.g., 27 MHz.

The IF trap circuit 63 comprises a coil 73 and a capacitor 74 the respective one end of which is connected in parallel to the other end of the capacitor 70. A resonance frequency of a parallel resonance circuit comprising the coil 73 and the capacitor 74 is set to an intermediate frequency region of television signals (59 MHz in Japan and 46 MHz in the United States).

The tuning circuit 64, as shown in FIG. 3, comprises a tuning coil 80 for high band reception, a DC blocking capacitor 79, a tuning coil 78 for low band reception, a tuning coil 75 for low band reception, a tuning coil 76 for high band reception, and a DC blocking capacitor 77, which are connected in series, connected in parallel with a varactor diode 81 and a DC blocking capacitor 82, which are connected in series. The varactor diode 81 has an anode connected with the coil 80 and a cathode connected with the capacitor 82. The other ends of the DC blocking capacitor 77 and the EC blocking capacitor 82 are grounded. A connection point between the coil 76 and the capacitor 77 is grounded through a resistor 83 and connected with the switching terminal 66 through a resistor 84. A connection point between the coils 75 and 76 is connected with the switching terminal 67 through a DC stopping capacitor 85 and a resistor 86. The switching terminal 67 is grounded through a resistor 87.

Next, a switch diode 88 is connected between a connection point between the capacitor 85 and the resistor 86 and a connection point between the coil 78 and the capacitor 79. The switch diode 88 has an anode connected with the capacitor 85 and a cathode connected with the coil 78. A connection point between the capacitor 79 and the coil 80 is grounded through a resistor 89, and the cathode of the varactor diode 81 is connected with a tuning voltage supplying terminal 91 through a feeding resistor 90.

The output part 65 comprises a varactor diode 92 having an anode connected with the anode of the varactor diode 81, a DC blocking capacitor 93 connected at one end thereof with the cathode of the varactor diode 92, and a feeding resistor 94 connected between the cathode of the varactor diode 92 and the tuning voltage supplying terminal 91. The other end of the DC blocking capacitor 93 is connected with an amplifier 95 of the next stage so that a television signal outputted by the input circuit of the television tuner is amplified by the amplifier 95.

In the configuration as described above, when the tuning circuit 64 is switched so as to receive television signals of high band, a voltage of, e.g., 5V is applied to the switching terminal 67 for high band reception, and no voltage is applied to the switching terminal 66 for low band reception. At this time, a forward voltage is applied to the switch diode 88, which is brought into conduction, and the tuning circuit 64 operates as a tuning circuit comprising the coils 76 and 80, and the varactor diode 81. As a result, reception of signals of high frequency band is enabled, a signal of a desired tuning frequency is obtained by adjusting voltages applied to the tuning voltage supplying terminal 91, and the signal is outputted to the amplifier 95.

On the other hand, when the tuning circuit 64 is switched so as to receive television signals of low band, a voltage of, e.g., 5V is applied to the switching terminal 66 for low band reception, and no voltage is applied to the switching terminal 67 for high band reception. At this time, a reverse voltage is applied to the switch diode 88, which is brought out of conduction, and the tuning circuit 64 operates as a tuning circuit comprising the coils 75, 76, 78, and 80, and the varactor diode 81. As a result, reception of signals of low frequency band is enabled, a signal of a desired tuning frequency is obtained by adjusting voltages applied to the tuning voltage supplying terminal 91, and the signal is outputted to the amplifier 93.

However, in the television tuner input circuit, the CB trap circuit 62 and the IF trap circuit 63 have the property of transmitting signals at a frequency band (86 to 109 MHz), which is half the frequency band of high band television signals (171 to 217 MHz in Japan and 175 to 211 MHz in the United States). For this reason, in high band reception, signals having half of signal frequencies to be received are not so highly attenuated because they are attenuated due to the tuning properties of the tuning circuit 64 only.

The dotted line C of FIG. 2 shows the selection property of the television tuner input circuit. As shown in the drawing, signals at a frequency band (86 to 109 MHz), whose frequencies are is half of those of the frequency band of high band television signals, are not sufficiently attenuated.

In such a state, signals (FM broadcasting signals) at an FM broadcasting band, whose frequencies are half of those of high band television signals, are inputted to the amplifier 95 to amplify the signals, while harmonics having twice the frequencies, that is, the harmonics of the same frequencies as signals of frequencies to be received are generated and interfere with television signals to be received.

SUMMARY OF THE INVENTION

The present invention has been to solve the problem and provides a television tuner input circuit that has satisfactory selection properties with reduced interference by FM broadcasting signals in high band reception state.

To solve the above problem, a television tuner input circuit of the present invention has a tuning circuit and a high pass filter cascaded to the tuning circuit, wherein: the tuning circuit is switched to a low band or high band television signal reception state; when the tuning circuit is switched to the low band reception state, a cutoff frequency of the high pass filter is set lower than the minimum frequency of the low band; and when the tuning circuit is switched to the high band reception state, a cutoff frequency is set lower than the minimum frequency of the high band and higher than half of the maximum frequency thereof.

Also, according to the present invention, the high pass filter is configured with a constant K type filter comprising a capacitive element and an inductance element so that both the capacitive value of the capacitive element and the inductance value of the inductance element in the high band reception state are smaller than the capacitive value of the capacitive element and the inductance value of the inductance element in the low band reception state.

Furthermore, according to the present invention, the inductance element has first and second coils, wherein: one end of the first coil is connected with the capacitive element and the other end is high-frequency grounded; one end of the second coil is connected with the capacitive element and the other end is high-frequency grounded through a switch diode; when the tuning circuit is switched to the low band reception state, the switch diode is brought out of conduction; and when the tuning circuit is switched to the high band reception state, the switch diode is brought into conduction.

Furthermore, according to the present invention, the capacitive element is configured with a varactor diode; when the tuning circuit is switched to the high band reception state, a reverse-biased voltage applied to the varactor diode is set higher than the reverse-biased voltage when switched to the low band reception state; and when the tuning circuit is switched to the high band reception state, the reverse-biased voltage is applied to the varactor diode through the switch diode.

Furthermore, according to the present invention, the tuning circuit has first and second band switching terminals for applying a switching voltage for switching to a low band or high band television signal reception state; the reverse-biased voltage at switching to the low band reception state is applied through a first resistor from the first band switching terminal; and the reverse-biased voltage at switching to the high band reception state is applied through a second resistor from the second band switching terminal.

According to the present invention, the other end of the first coil is grounded through a capacitor and a series resonance frequency by the first coil and the capacitor is set to a frequency used with citizen band transceivers.

BRIEF DESCRIPTION OF THE DRAWINGS

Preferred embodiments of the present invention will be described in detail based on the followings, wherein.

DESCRIPTION OF THE PREFERRED EMBODIMENTS

Hereinafter, embodiments of a television tuner input circuit of the present invention will be described with reference to FIGS. 1 and 2.

Figure 1:
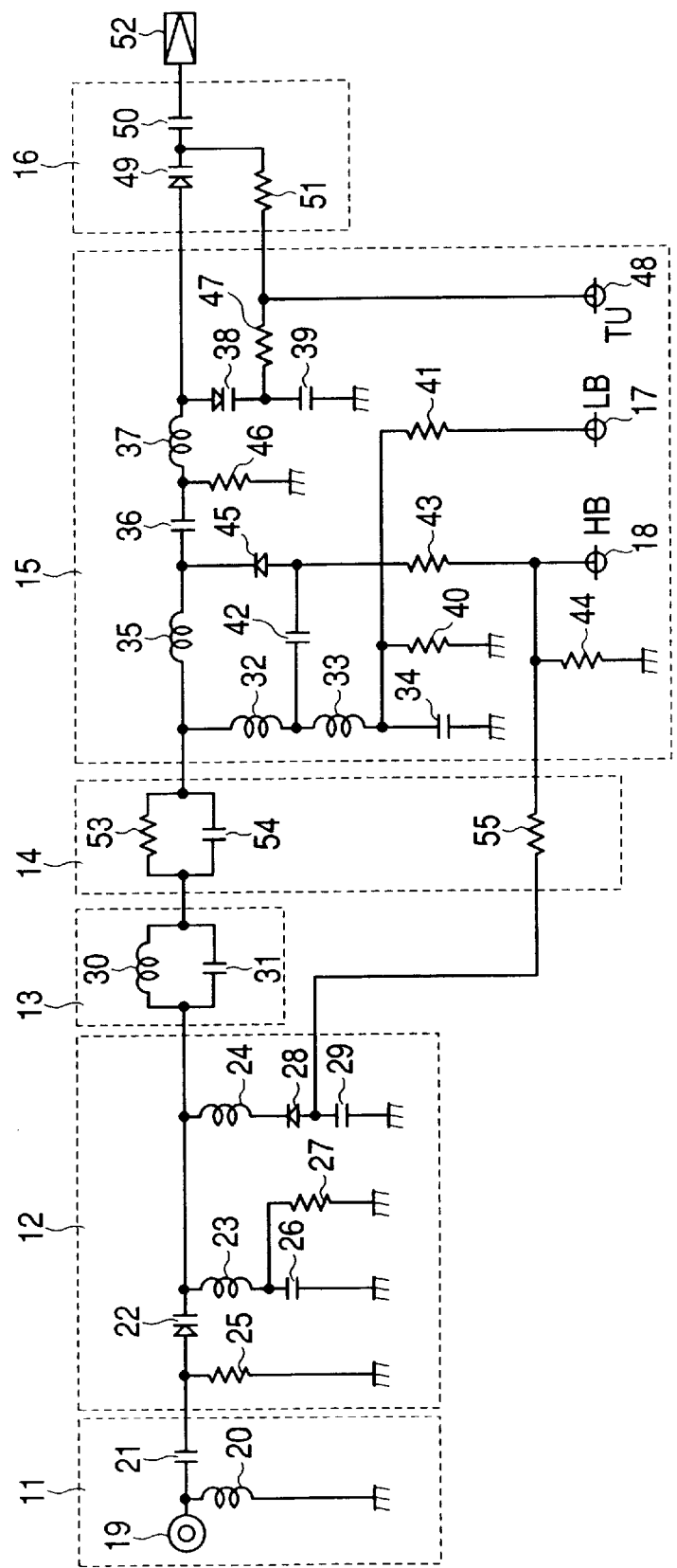
FIG. 1 is a schematic diagram showing an embodiment of a television tuner input circuit of the present invention.

FIG. 1 is a schematic diagram showing an embodiment of the television tuner input circuit of the present invention. The television tuner input circuit comprises an input part 11, a high pass filter 12, an IF trap circuit 13, a bias circuit 14, a tuning circuit 15, and an output part 16, which are serially cascaded. The tuning circuit 15 has first and second band switching terminals 17 and 18 wherein a switching voltage for switching the tuning circuit 15 to a low band television signal reception state is applied to the first band switching terminal 17 and a switching voltage for switching the tuning circuit 15 to a high band television signal reception state is applied to the second band switching terminal 18.

The input part 11 comprises an input terminal 19 for television signals, a coil 20 connected between the input terminal 19 and the ground, and a DC blocking capacitor 21 connected at one end thereof to the input terminal 19. The input terminal 19, connected with a television antenna (not shown), serves as an input terminal for television signals. The input circuit 11 is primarily used as provision against lighting.

The high pass filter 12 comprises first and second coils 23 and 24 (inductance elements) each connected in parallel with the varactor diode 22 (capacitive element). The varactor diode 22 has the anode connected with the other end of the DC blocking capacitor 21 and grounded through a resistor 25, and the cathode connected with the IF trap circuit 13. The cathode of the varactor diode 22 is connected with the first coil 23, the other end of which is grounded through a capacitor 26 and a resistor 27 connected in parallel.

Furthermore, the cathode of the varactor diode 22 is connected with the second coil 24, the other end of which is connected with the cathode of a switch diode 28, the anode of which is grounded through a DC blocking capacitor 29.

The varactor diode 22, and the first coil 23 and second coil 24 make up a constant K type high pass filter.

A series resonance circuit comprising the first coil 23 and the capacitor 26 has a resonance frequency set to a frequency used with citizen band transceivers, e.g., 27 MHz, and makes up a CB trap circuit.

The IF trap circuit 13 is configured with a parallel resonance circuit comprising a coil 30 and a capacitor 31, and one end of the IF trap circuit 13 is connected with the cathode of the varactor diode 22. Its resonance frequency is set to an intermediate frequency of television signals (59 MHz in Japan and 46 MHz in the United States).

The bias circuit 14 comprises a first resistor 53 for low band reception, a DC blocking capacitor 54, and a second resistor 55 for high band reception, which are connected in parallel. The respective one end of the first resistor 53 and the DC blocking capacitor 54 is connected with the other end of the IF trap circuit 13, and the second resistor 55 is connected between the second band switching terminal 18 and the anode of the switch diode 28. The first and second resistors 53 and 55 are used to apply voltage to the cathode of the varactor diode 22.

The tuning circuit 15, as shown in the drawing, comprises a tuning coil 37 for high band reception, a DC blocking capacitor 36, a tuning coil 35 for low band reception, a tuning coil 32 for low band reception, a tuning coil 33 for high band reception, a DC blocking capacitor 34, which are connected in series, connected in parallel with a varactor diode 38 and a DC blocking capacitor 39, which are connected in series. The varactor diode 38 has the anode connected with the tuning coil 37 and the cathode connected with the capacitor 39. The respective other end of the DC blocking capacitor 34 and the DC blocking capacitor 39 is grounded, and a connection point between the tuning coil 35 and the tuning coil 32 is connected with the respective other end of the first resistor 53 and the DC blocking capacitor 54.

Next, a connection point between the tuning coil 33 and the DC blocking capacitor 34 is grounded through a resistor 40 and connected with the first band switching terminal 17 through a resistor 41. A connection point between the tuning coil 32 and the tuning coil 33 is connected with the second band switching terminal 18 through a DC blocking capacitor 42 and a resistor 43. Furthermore, the second band switching terminal 18 is grounded through a resistor 44. A connection point between the DC blocking capacitor 42 and the resistor 43 is connected with the anode of a switch diode 45, and the cathode of the switch diode 45 is connected with a connection point between the tuning coil 35 and the DC blocking capacitor 36. A connection point between the DC blocking capacitor 36 and the tuning coil 37 is grounded through a resistor 46, and the cathode of the varactor diode 38 is connected with a tuning voltage supplying terminal 48 through a feeding resistor 47.

The output part 16 comprises a varactor diode 49 having an anode connected with the anode of the varactor diode 38, a DC blocking capacitor 50 connected at one end thereof with the cathode of the varactor diode 49, and a resistor 51 connected between the cathode of the varactor diode 49 and the tuning voltage supplying terminal 48. The other end of the DC blocking capacitor 50 is connected with an amplifier 52 of the next stage so that a television signal outputted from the television tuner input circuit is amplified by the amplifier 50.

In the configuration as described above, when the tuning circuit 15 is switched so as to receive television signals of high band, a voltage of, e.g., 5V is applied to the second switching terminal 18 for high band reception, and no voltage is applied to the first switching terminal 17 for low band reception. At this time, a forward voltage is applied to the switch diode 45, which is brought into conduction, and the tuning circuit 15 operates as a tuning circuit comprising the coils 33 and 37, and the varactor diode 38. As a result, reception of signals of high frequency band is enabled, a signal of a desired tuning frequency is obtained by adjusting voltages applied to the tuning voltage supplying terminal 48, and the signal is outputted to the amplifier 52.

On the other hand, when the tuning circuit 15 is switched so as to receive television signals of low band, a voltage of, e.g., 5V is applied to the first band switching terminal 17 for low band reception, and no voltage is applied to the second switching terminal 18 for high band reception. At this time, a reverse voltage is applied to the switch diode 45, which is brought out of conduction, and the tuning circuit 15 operates as a tuning circuit comprising the coils 32, 33, 35, and 37, and the varactor diode 38. As a result, reception of signals of low frequency band is enabled, a signal of a desired tuning frequency is obtained by adjusting voltages applied to the tuning voltage supplying terminal 48, and the signal is outputted to the amplifier 52.

By the way, when a television signal of low band is received, a voltage applied to the first band switching terminal 17 for low band reception turns into a reverse-biased voltage of the varactor diode 22 through the first resistor 53. At this time, the switch diode 28 is brought out of conduction. As a result, for a trap frequency (27 MHz) of a CB trap circuit or higher frequencies, the high pass filter 12 operates as a constant K type filter circuit comprising the varactor diode 22 and the coil 23. Its cutoff frequency is set to a lower frequency (e.g., 55 MHz) than the minimum frequency of low band television signals (91 to 103 MHz in Japan and 55 to 83 MHz in the United States).

Next, when a television signal of high band is received, a voltage applied to the second band switching terminal 18 for high band reception is applied to the switch diode 28 through the second bias resistor 55, the switch diode 28 is brought into conduction, and the voltage turns into a reverse-biased voltage of the varactor diode 22. The second coil 24 is connected in parallel with the first coil 23.

The first resistor 53 and the second resistor 55 are set so that the reverse-biased voltage of the varactor diode 22 at the high band reception is higher than that at the low band reception.

For a trap frequency (27 MHz) of the CB trap circuit or higher frequencies, the high pass filter 12 operates as a constant K type filter circuit comprising the varactor diode 22, and the first and second coils 23 and 24 connected in parallel with each other. Since both the capacity value of the capacitive element and the inductance value of the inductance element are smaller than those at the low band reception, a cutoff frequency can be set higher than that at the low band reception.

A cutoff frequency is set to a frequency, e.g., 120 MHz, that is lower than the minimum frequency of the frequency band of high band television signals (171 to 217 MHz in Japan and 175 to 211 MHz in the United States) and higher than half of the maximum frequency.

By the above-described configuration and settings, when a television signal of high band is received, the input circuit for the television signal provides sufficient attenuation for a frequency band (86 to 109 MHz), whose frequencies are half of those of the frequency band of high band television signals, and as a result, even if signals (FM broadcasting signals) at an FM broadcasting band, whose frequencies are half of those of high band television signals, are inputted, the level of harmonics having twice the frequencies generated in the amplifier 52 is low.

Figure 2:
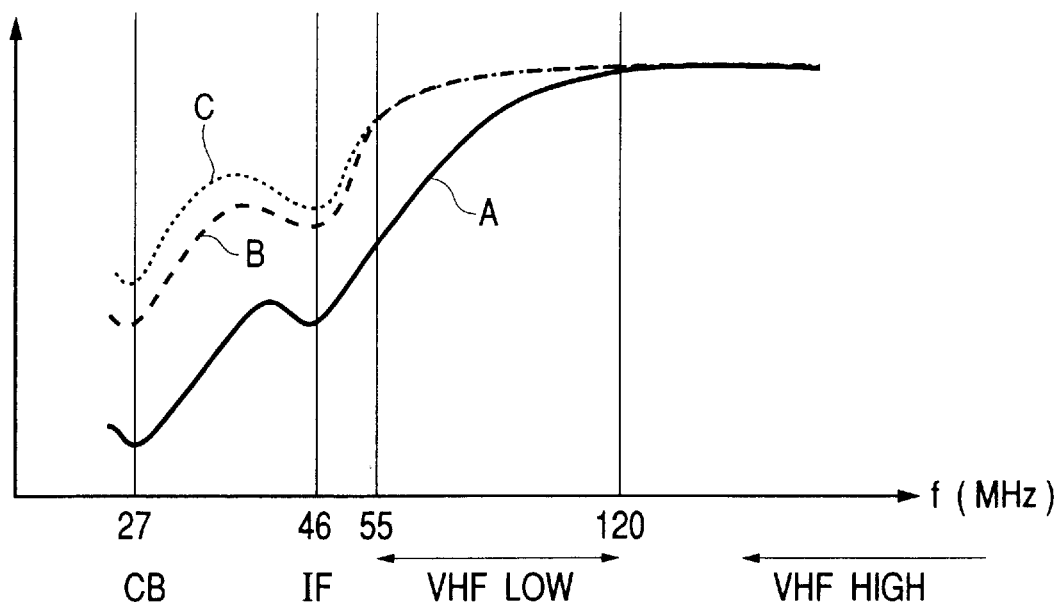
FIG. 2 is a diagram showing the selection property of the television tuner input circuit of the present invention and the prior art.
Figure 3:
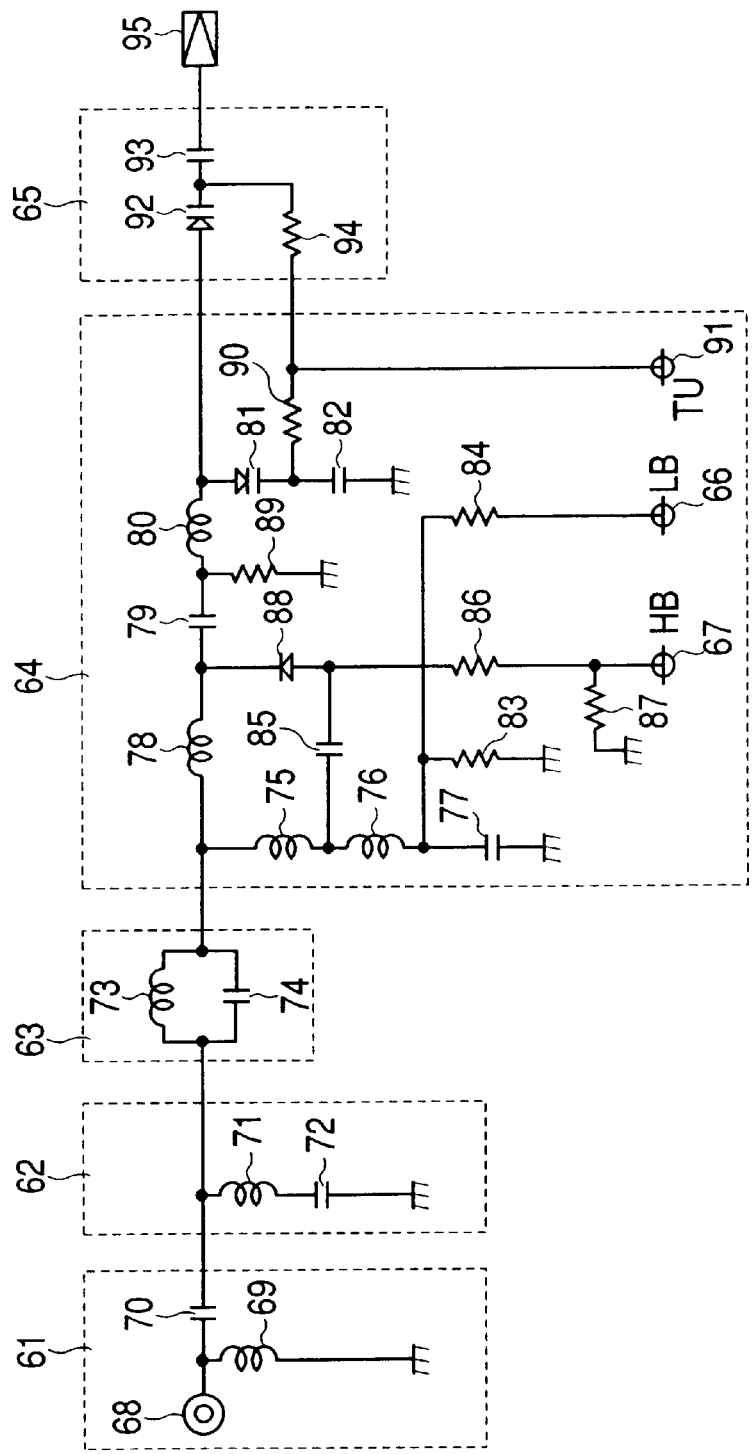
FIG. 3 is a schematic diagram of a conventional television tuner input circuit.

FIG. 2 shows the selection property of the television tuner input circuit wherein the dashed line shows the property of the circuit at low band reception and the solid line shows the property of the circuit at high band reception. As shown in the drawing, excellent effects are observed in the selection property at high band reception, particularly during reception at lower frequency bands than 120 MHz.

As has been described above, a television tuner input circuit of the present invention has a tuning circuit and a high pass filter cascaded to the tuning circuit, wherein: the tuning circuit is switched to a low band or high band television signal reception state; when the tuning circuit is switched to the low band reception state, a cutoff frequency of the high pass filter is set lower than the minimum frequency of the low band; and when the tuning circuit is switched to the high band reception state, a cutoff frequency is set lower than the minimum frequency of the high band and higher than half of the maximum frequency thereof. By this construction, even if FM broadcasting signals of half of high band frequencies are inputted, interference by harmonics having twice the frequencies can be eliminated.

Also, according to the present invention, the high pass filter is configured with a constant K type filter comprising a capacitive element and an inductance element so that both the capacitive value of the capacitive element and the inductance value of the inductance element in the high band reception state are smaller than the capacitive value of the capacitive element and the inductance value of the inductance element in the low band reception state. By this construction, nominal impedance of the constant K type filter is kept almost constant and therefore the impedance of the constant K type filter can be matched to that of preceding and following circuits connected to the constant K type filter.

Furthermore, according to the present invention, the inductance element has first and second coils wherein: one end of the first coil is connected with the capacitive element and the other end is high-frequency grounded; one end of the second coil is connected with the capacitive element and the other end is high-frequency grounded through a switch diode; when the tuning circuit is switched to the low band reception state, the switch diode is brought out of conduction; and when the tuning circuit is switched to the high band reception state, the switch diode is brought into conduction. By this construction, inductance values of the inductance element can be easily switched.

Furthermore, according to the present invention, the capacitive element is configured with a varactor diode; when the tuning circuit is switched to the high band reception state, a reverse-biased voltage applied to the varactor diode is set higher than the reverse-biased voltage when switched to the low band reception state; and when the tuning circuit is switched to the high band reception state, the reverse-biased voltage is applied to the varactor diode through the switch diode. By this construction, capacity values of the capacitive element can be easily switched.

Furthermore, according to the present invention, the tuning circuit has first and second band switching terminals for applying a switching voltage for switching to the low band or high band television signal reception state; the reverse-biased voltage at switching to the low band reception state is applied through a first resistor from the first band switching terminal; and the reverse-biased voltage at switching to the high band reception state is applied through a second resistor from the second band switching terminal. By this construction, a reverse-biased voltage to be applied to the varactor diode can be changed by using a voltage to be applied to switch bands.

Furthermore, according to the present invention, the other end of the first coil is grounded through a capacitor and a series resonance frequency by the first coil and the capacitor is set to a frequency used with citizen band transceivers. By this configuration, circuit configuration is simplified because a dedicated trap circuit and the like for attenuating the frequency for citizen band transceivers are not required.

What is claimed is:

1. A television tuner input circuit comprising a tuning circuit and a high pass filter cascaded to the tuning circuit, wherein:
   the tuning circuit is switched to a low band or high band television signal reception state;
   when the tuning circuit is switched to the low band reception state, a cutoff frequency of the high pass filter is set lower than the minimum frequency of the low band; and
   when the tuning circuit is switched to the high band reception state, a cutoff frequency is set lower than the minimum frequency of the high band and higher than half of the maximum frequency thereof.

2. The television tuner input circuit according to claim 1, wherein:
   the high pass filter is configured with a constant K type filter comprising a capacitive element and an inductance element; and
   both the capacitive value of the capacitive element and the inductance value of the inductance element in the high band reception state are smaller than the capacitive value of the capacitive element and the inductance value of the inductance element in the low band reception state.

3. The television tuner input circuit according to claim 2, wherein:
   the inductance element has first and second coils;
   one end of the first coil is connected with the capacitive element and the other end is high-frequency grounded;
   one end of the second coil is connected with the capacitive element and the other end is high-frequency grounded through a switch diode;
   when the tuning circuit is switched to the low band reception state, the switch diode is brought out of conduction; and when the tuning circuit is switched to the high band reception state, the switch diode is brought into conduction.

4. The television tuner input circuit according to claim 3, wherein:

the capacitive element is configured with a varactor diode;

when the tuning circuit is switched to the high band reception state, a reverse-biased voltage applied to the varactor diode is set higher than the reverse-biased voltage when switched to the low band reception state; and when the tuning circuit is switched to the high band reception state, the reverse-biased voltage is applied to the varactor diode through the switch diode.

5. The television tuner input circuit according to claim 4, wherein:

the tuning circuit has first and second band switching terminals for applying a switching voltage for switching to a low band or high band television signal reception state;

the reverse-biased voltage at switching to the low band reception state is applied through a first resistor from the first band switching terminal; and the reverse-biased voltage at switching to the high band reception state is applied through a second resistor from the second band switching terminal.

6. The television tuner input circuit according to claim 3, wherein the other end of the first coil is grounded through a capacitor and a series resonance frequency by the first coil and the capacitor is set to a frequency used with citizen band transceivers.

7. The television tuner input circuit according to claim 4, wherein the other end of the first coil is grounded through a capacitor and a series resonance frequency by the first coil and the capacitor is set to a frequency used with citizen band transceivers.

8. The television tuner input circuit according to claim 5, wherein the other end of the first coil is grounded through a capacitor and a series resonance frequency by the first coil and the capacitor is set to a frequency used with citizen band transceivers.

* * * * *

UNITED STATES PATENT AND TRADEMARK OFFICE
CERTIFICATE OF CORRECTION

PATENT NO. : 6,864,924 B2
DATED : March 8, 2005
INVENTOR(S) : Masaki Yamamoto

It is certified that error appears in the above-identified patent and that said Letters Patent is hereby corrected as shown below:

Title page,
Item [*] Notice, delete the phrase "by 723 days" and insert -- by 843 days --.

Signed and Sealed this

Twenty-seventh Day of September, 2005

JON W. DUDAS
*Director of the United States Patent and Trademark Office*

UNITED STATES PATENT AND TRADEMARK OFFICE
CERTIFICATE OF CORRECTION

PATENT NO. : 6,864,924 B2
DATED : March 8, 2005
INVENTOR(S) : Masaki Yamamoto

It is certified that error appears in the above-identified patent and that said Letters Patent is hereby corrected as shown below:

<u>Title page,</u>
Item [56], References Cited, U.S. PATENT DOCUMENTS, insert the following:
-- 4,499,495         2/1985         Strammello, Peter
   4,771,332         9/1988         Metoki, Toshihiro
   4,905,306         2/1990         Anderson, William D.
   5,483,209 A      1/1996         Takayama, Akira
   5,499,056 A      3/1996         Pugel, Michael A.
   6,035,185 A      3/2000         Dobrovolny et al.
   6,108,050 A      8/2000         Yamamoto et al.
   6,226,503 B1     5/2001         Yamamoto et al.
   6,342,928 B1     1/2002         Ohira, Koji
   6,351,294 B1     2/2002         Yamamoto et al.
   6,486,757 B2     11/2002        Yamamoto et al.
   6,665,022 B1     12/2003        Yamamoto et al.
   6,731,349 B1     5/2004         Van Der Wijst, Hendrikus Martinus --.

Signed and Sealed this

Sixth Day of June, 2006

JON W. DUDAS
*Director of the United States Patent and Trademark Office*